United States Patent
Koide

(10) Patent No.: US 7,463,505 B2
(45) Date of Patent: Dec. 9, 2008

(54) SEMICONDUCTOR MEMORY DEVICE AND ELECTRONIC APPARATUS

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 108 days.

(21) Appl. No.: 11/522,551

(22) Filed: Sep. 14, 2006

(65) Prior Publication Data

US 2007/0081374 A1 Apr. 12, 2007

(30) Foreign Application Priority Data

Oct. 6, 2005 (JP) .............................. 2005-294123

(51) Int. Cl.
*G11C 11/22* (2006.01)
(52) U.S. Cl. .................. 365/145; 365/149; 365/214
(58) Field of Classification Search ................. 365/63, 365/189.05, 191, 185.19, 185.2, 145, 149, 365/69, 214
See application file for complete search history.

(56) References Cited

U.S. PATENT DOCUMENTS

| | | | |
|---|---|---|---|
| 6,172,925 B1 * | 1/2001 | Bloker ................... | 365/210.12 |
| 6,252,814 B1 * | 6/2001 | Tran et al. .............. | 365/210.1 |
| 6,370,057 B1 * | 4/2002 | Akita ..................... | 365/149 |
| 6,649,945 B1 * | 11/2003 | Hosono et al. ......... | 257/210 |
| 6,870,754 B2 | 3/2005 | Sakuma | |
| 2003/0103391 A1 | 6/2003 | Kang | |
| 2003/0169616 A1 | 9/2003 | Noro | |
| 2004/0090810 A1 * | 5/2004 | Sakuma ................... | 365/145 |

FOREIGN PATENT DOCUMENTS

JP 3597185 9/2004

OTHER PUBLICATIONS

Shoichiro Kawashima, Bitline GND Sensing Technique for Low-Voltage Operation FeRAM, IEEE Journal of Solid-State Circuits, IEEE Service Center, Piscataway, NJ, US, vol. 37, No. 5, May 2002, pp. 592-598.*
IEEE Journal of Solid-State Circuits, vol. 37, No. 5, May 2002 p. 592-598 "Bitline GND Sensing Technique for Low-Voltage Operation FeRAM".

* cited by examiner

*Primary Examiner*—Dang T Nguyen
(74) *Attorney, Agent, or Firm*—Harness, Dickey & Pierce, P.L.C.

(57) ABSTRACT

A semiconductor memory device having: a memory cell array with m memory cells arranged in a first direction and n memory cells arranged in a second direction in a grid, each memory cell having a capacitor part using a ferroelectric film, and also having a first terminal, a second terminal, and a third terminal; two or more first wirings connecting the first terminals of the m memory cells arranged in the first direction; two or more second wirings connecting the second terminals of the n memory cells arranged in the second direction; two or more third wirings connecting the third terminals of the m memory cells, and means for selecting a third wiring from among the third wirings, the third wiring being selected based on the result of calculation in an adder circuit and a subtractor circuit.

6 Claims, 17 Drawing Sheets

SEMICONDUCTOR MEMORY DEVICE AND ELECTRONIC APPARATUS

CROSS-REFERENCES TO RELATED APPLICATIONS

The entire disclosure of Japanese Patent Application No. 2005-294123, filed on Oct. 6, 2005 is expressly incorporated herein by reference.

BACKGROUND

1. Technical field

The present invention relates to a semiconductor memory device, and an electronic apparatus containing the same, and more specifically, a semiconductor memory device having a capacitor part using a ferroelectric film, or similar.

2. Related Art

Ferroelectric random access memory (FeRAM) devices, which store information by utilizing the hysteresis found between the polarization and electric field of ferroelectric material, have been gathering attention because of their high-speed operation, low power consumption and non-volatility.

Each of the ferroelectric memory cells constituting a memory cell array is connected to a word line and a plate line, which extend in a row direction, and also to a bit line, which extends in a column direction.

However, with the aforementioned configuration, when reading information from a selected cell, information in unselected memory cells in the same row as the selected memory cell will also appear on a bit line because the unselected memory cells are connected to the same word line and plate line as the selected memory cell. In addition, FeRAM reading is what is called destructive reading, and requires re-writing after reading. Accordingly, it is necessary to re-write data to not only the selected memory cell but also the memory cells in the same row as the selected memory cell.

Meanwhile, the ferroelectric material that constitutes a memory cell capacitor deteriorates as the number of information reads/writes increases. Reducing that deterioration is important for extending the life of ferroelectric random access memory.

As an example of related art, an article titled "Bitline GND Sensing Technique for Low-Voltage Operation FeRAM" (IEEE Journal of Solid-State Circuits, Vol. 37, No. 5, May 2002, p.p. 592-598) discloses a technique in which the plate lines change their displacements, forming in a step-like pattern, so that memory cells arranged in the same row direction do not connect with the same plate line.

As an example of related art, JP-A-2004-164730 discloses a technique in which four memory cells are connected to each plate line and word line in an 8-row by 8-column ferroelectric random access memory cell array to reduce the number of unnecessary accesses, reducing ferroelectric random access memory cell deterioration.

SUMMARY

However, there are dummy cell regions in the memory cell array structure disclosed in the aforementioned article (see FIG. 10B). In addition, the number of plate lines is larger, and the driver circuit is also larger. The impact of these dummy cell regions and the increased number of plate lines becomes significant as the memory capacity becomes larger.

Meanwhile, in the memory cell structure disclosed in JP-A-2004-164730, the word line and plate line have complicated shapes, making it difficult to improve the memory characteristics and reduce the memory cell area.

An advantage of some aspects of the present invention is the reduction in size, or integration density improvement, of a memory cell area by optimizing the wiring layout. Another advantage is the improvement of memory characteristics. Yet another advantage is the provision of a memory cell selection means that responds to changes in wiring layout.

(1) A semiconductor memory device according to an aspect of the invention includes: a memory cell array with m memory cells arranged in a first direction and n memory cells arranged in a second direction in a grid, each memory cell having a capacitor part using a ferroelectric film, and also having a first terminal, a second terminal, and a third terminal; two or more first wirings connecting the first terminals of the m memory cells arranged in the first direction; two or more second wirings connecting the second terminals of the n memory cells arranged in the second direction; and two or more third wirings connecting the third terminals of the m memory cells, the third wirings including, from among unit blocks resulting from dividing the memory cell array into q sections in the first direction and r sections in the second direction, each unit block having s memory cells arranged in the first direction and t memory cells arranged in the second direction in a grid, first to t-th wiring parts connecting the s memory cells arranged in the first direction in a first unit block, first to t-th wiring parts connecting the s memory cells arranged in the first direction in a second unit block located next to the first unit block in the first direction, and connection wiring parts connecting the first to t-th wiring parts in the first unit block and the first to t-th wiring parts in the second unit block so that the wiring parts with the same level are not connected, and also connecting ends on the second unit block side of the wiring parts in the first unit block and ends on the first unit block side of the wiring parts in the second unit block, wherein the connection wiring parts are crossed between the first unit block and the second unit block.

Accordingly, the first to t-th wiring parts in the first unit block and the first to t-th wiring parts in the second unit block are connected via the connection wiring parts so that the wiring parts with the same level are not connected, and the number of memory cells connected to the same first and third wirings decreases, making it possible to improve the characteristics of the semiconductor memory device.

Since the connection wiring parts are crossed between the blocks, reducing the size or improving the integration density of the memory cell array becomes possible.

The first wirings are, for example, word lines; the second wirings are, for example, bit lines; and the third wirings are, for example, plate lines. Also, m, n, q, r, s, t, and v are natural numbers.

(2) The semiconductor memory device according to another aspect of the invention is one in which, from among first to s-th second wirings, in the second wirings, connecting the t memory cells arranged in the second direction in each of the first and second unit blocks, the connection wiring parts are crossed between the s-th second wiring in the first unit block and the first second wiring in the second unit block.

As stated above, the first to t-th wiring parts in the first unit block and the first to t-th wiring parts in the second unit block are connected with the connection wiring parts so that the wiring parts with the same level are not connected, making it possible to reduce the number of memory cells connected to the same first and third wirings, and improve the semiconductor memory device characteristics.

Furthermore, the connection wiring parts being crossed between the second wiring parts makes reducing the size or improving the integration density of the memory cell array possible. Also, the connection wiring parts can be made so that they are crossed using the layer where the second wirings are formed.

(3) The semiconductor memory device according to still another aspect of the invention includes: a memory cell array with m memory cells arranged in a first direction and n memory cells arranged in a second direction in a grid, each memory cell having a capacitor part using a ferroelectric film, and also having a first terminal, a second terminal, and a third terminal; two or more first wirings connecting the first terminals of the m memory cells arranged in the first direction; two or more second wirings connecting the second terminals of the n memory cells arranged in the second direction; two or more third wirings connecting the third terminals of the m memory cells, the third wirings including, from among unit blocks resulting from dividing the memory cell array into q sections in the first direction and r sections in the second direction, each unit block having s memory cells arranged in the first direction and t memory cells arranged in the second direction in a grid, first to t-th wiring parts connecting the s memory cells arranged in the first direction in a first unit block, first to t-th wiring parts connecting the s memory cells arranged in the first direction in a second unit block located next to the first unit block in the first direction, and a connection wiring part connecting a u-th ($1 \leq u \leq t$) wiring part from among the first to t-th wiring parts in the first unit block and a wiring part other than a u-th ($1 \leq u \leq t$) wiring part from among the first to t wiring parts in the second unit block; and means for selecting a third wiring from among the third wirings, the third wiring being selected based on the result of calculation in an adder circuit and a subtractor circuit.

As stated above, even though the u-th wiring part in the first unit block and the wiring part other than the u-th wiring part in the second block are connected via the connection wiring part, the third wiring can easily be selected based on the adder circuit and the subtractor circuit's calculation results.

The first wirings are, for example, word lines; the second wirings are, for example, bit lines; and the third wirings are, for example, plate lines. Also, m, n, q, r, s, t, and v are natural numbers.

(4) The semiconductor memory device according to yet another aspect of the invention includes: a memory cell array with m memory cells arranged in a first direction and n memory cells arranged in a second direction in a grid, each memory cell having a capacitor part using a ferroelectric film, and also having a first terminal, a second terminal, and a third terminal; two or more first wirings connecting the first terminals of the m memory cells arranged in the first direction; two or more second wirings connecting the second terminals of the n memory cells arranged in the second direction; two or more third wirings connecting the third terminals of the m memory cells, the third wirings including, from among unit blocks resulting from dividing the memory cell array into q sections in the first direction and r sections in the second direction, each unit block having s memory cells arranged in the first direction and t memory cells arranged in the second direction in a grid, first to t-th wiring parts connecting the s memory cells arranged in the first direction in a first unit block, and first to t-th wiring parts connecting the s memory cells arranged in the first direction in a second unit block located next to the first unit block in the first direction, and a connection wiring part connecting a u-th ($1 \leq u \leq t$) wiring part from among the first to t-th wiring parts in the first unit block and a wiring part other than a u-th ($1 \leq u \leq t$) wiring part from among the first to t wiring parts in the second unit block; and means for selecting a third wiring from among the third wirings, wherein: t is the v-th power of 2; and the means for selecting the third wiring selects the third wiring based on an adder circuit's calculation result.

As stated above, t being the v-th power of 2 makes it possible to select the third wiring based on the adder circuit's calculation result, eliminating the need for a subtractor circuit and simplifying the circuitry. It is also possible to downsize the peripheral circuits.

The first wirings are, for example, word lines; the second wirings are, for example, bit lines; and the third wirings are, for example, plate lines. Also, m, n, q, r, s, t, u, and v are natural numbers.

(5) An electronic apparatus according to yet another aspect of the invention is one having the aforementioned semiconductor memory device. "Electronic apparatus(es)" here mean devices in general having a certain function, that include the semiconductor memory device according to the invention, and the device structures are not limited, and may include any devices including the semiconductor memory device according to the invention, such as computer apparatuses in general, portable telephones, PHSs, PDAs, electronic organizers, IC cards, or any other devices requiring a memory device.

DESCRIPTION OF EXEMPLARY EMBODIMENTS

Embodiment 1

Figure 1:
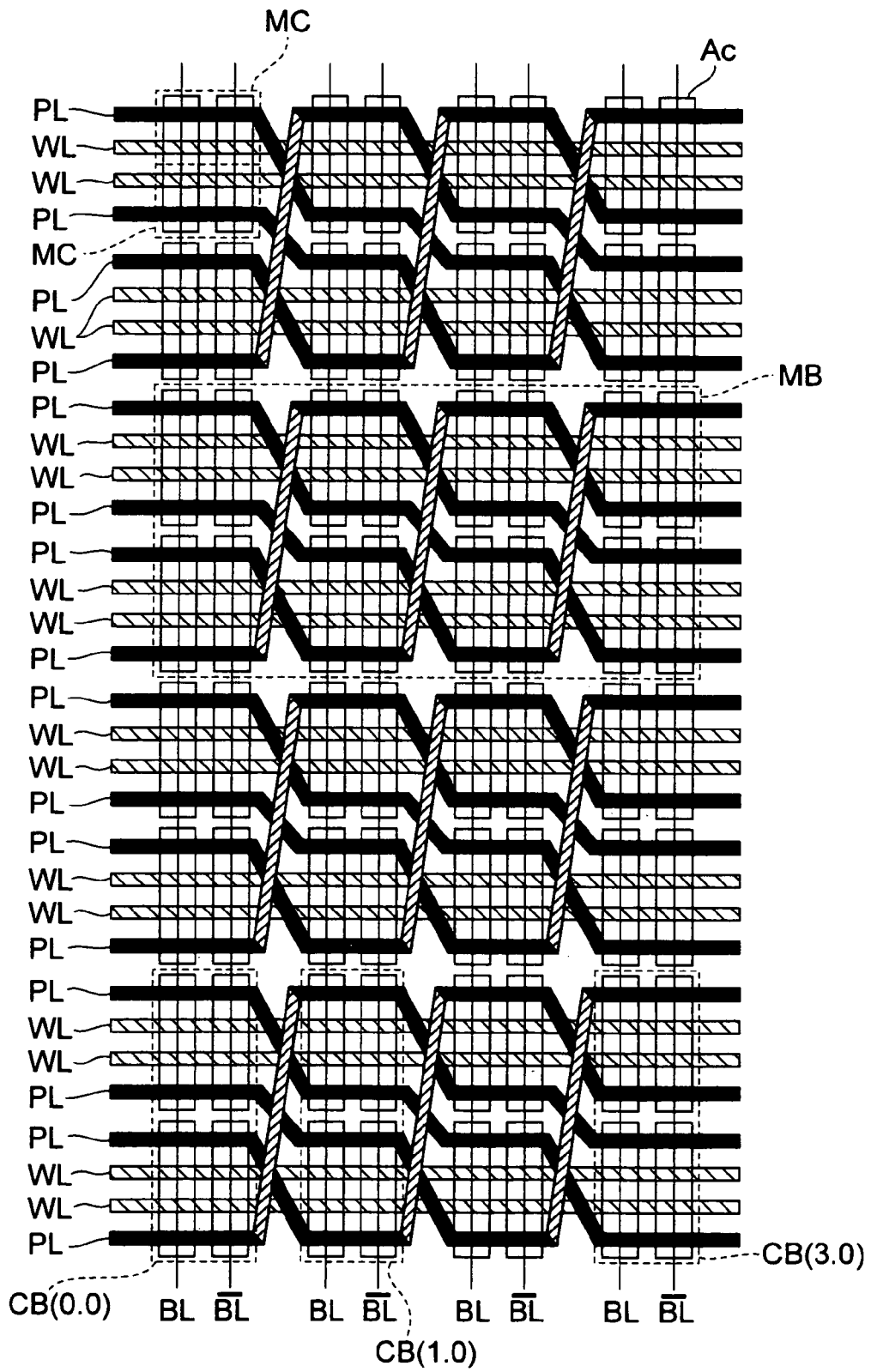
FIG. 1 is a schematic plain view of a main part of ferroelectric random access memory according to Embodiment 1.

An embodiment of the invention will be explained in detail with reference to the drawings. The same or related reference numerals are given to components with the same function, and the explanations of those components will not be repeated.

First, the characteristic structure of the Embodiment will be explained with reference to FIG. 1. The detailed structure will be explained later with reference to FIGS. 2 to 8.

FIG. 1 is a schematic plain view of a main part of ferroelectric random access memory (semiconductor memory device) according to the Embodiment. FIG. 1 shows that memory cells MC are arranged in 16 rows and 4 columns, forming a memory cell array. Word lines WL extend in a first direction (row direction or word line direction), and bit lines (BL, /BL) extend in a second direction (column direction or bit line direction).

Each memory cell MC has a transistor part and a capacitor part, the transistor parts are arranged at the portions where the word lines WL and the bit lines (BL, /BL) cross, and the capacitor parts are arranged at the portions where the plate lines PL and the bit lines (BL, /BL) cross.

Accordingly, two memory cells are arranged in an element-formed region Ac that is substantially rectangular lengthwise in the second direction. The memory cell array according to this Embodiment has adopted a 2T2C cell configuration, and one memory cell consists of two transistors and two capacitors arranged in the first direction.

Figure 3:
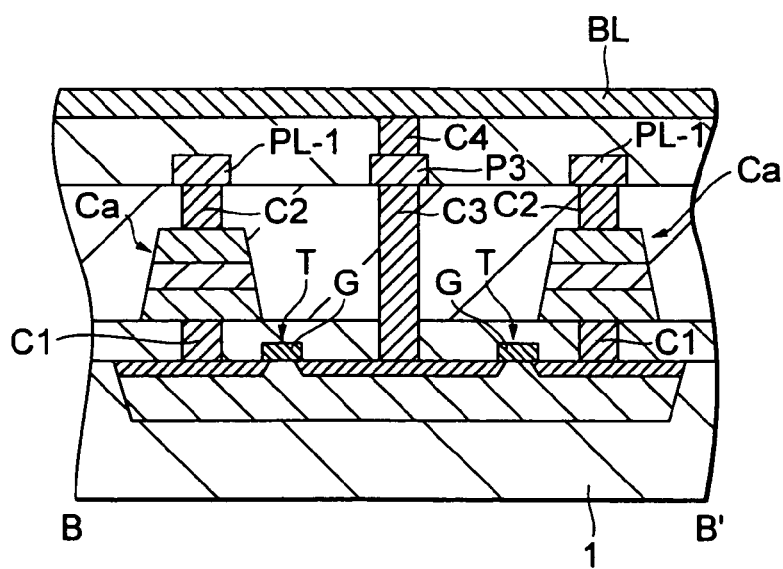
FIG. 3 is a cross-sectional view of a main part of ferroelectric random access memory according to Embodiment 1.

The memory cell MC has at least three terminals (the source/drain region portion of the transistor part, the upper electrode portion of the capacitor part, and the gate electrode portion) (see FIG. 3).

Here, a characteristic structure of the ferroelectric random access memory according to this Embodiment will be explained. A memory cell array (16 rows by 4 columns) are divided into memory blocks MB arranged in four rows by four columns (4×4 sections), and each memory block is divided into column blocks CB (unit blocks) arranged in four rows and one column(4×1 sections). In other words, a memory cell array (16 rows by 4 columns) are divided into (16) column blocks arranged in four rows and four columns. Each of these column blocks consists of memory cells arranged in four rows and one column.

Each of the word lines WL, which extend in the first direction, is connected to memory cells MC arranged on the same row. Each of bit line pairs (BL, /BL), which extend in the second direction, is connected to the memory cells arranged in the same column.

Each of the plate lines PL is arranged so that it changes its displacement with respect to the second direction every column block CB. In other words, a plate wiring part (wiring part, plate line piece, or plate line straight line part) running straight in the first direction over the memory cell MC in each column block CB is connected via a displacement shift part (connection wiring part and displacement shift wiring part) to the plate wiring part the next lower in the neighboring column block CB.

However, the lowermost plate wiring part in each column block CB is connected to the uppermost plate wiring part in the neighboring column block CB.

For example, the uppermost (first) plate wiring part in a column block (0, 0), which is the zeroth in the first direction and the zeroth in the second direction, is connected via a displacement shift part to the second plate wiring part (1, 0), which is the first in the first direction and the zeroth in the second direction (1, 0). Similarly, the second plate wiring part in the column block (0, 0) is connected via a displacement shift part to the third plate wiring part in the column block (1, 0), and the third plate wiring part in the column block (0, 0) is connected via a displacement shift part to the fourth plate wiring part in the column block (1, 0).

However, the lowermost (fourth) plate wiring part in the column block (0, 0) is connected to the first plate wiring part in the column block (1, 0). The connection part is arranged so that it crosses the aforementioned displacement shift parts, so it is referred to as a "crossover displacement shift part (crossover part)". In other words, the connection wiring parts (4 lines), which connect the plate wiring parts, consist of three displacement shift parts and one crossover displacement shift part. The same wirings are provided between column blocks (1, 0) and (2, 0), and between (2, 0) and (3, 0).

As described above, in this Embodiment, the first to t-th (here, t=4) plate wiring parts in a column block and the first to t-th plate wiring parts in the neighboring column block are connected via the respective displacement shift or crossover displacement shift parts so that the plate wiring parts with the same level are not connected to each other. Accordingly, the number of memory cells connected in common to a word line and plate line decreases, making it possible to decrease the number of reads/re-writes from/to non-selected cells. Consequently, it is possible to prevent deterioration of ferroelectric material in the capacitor parts, and thus improve the ferroelectric memory characteristics. It is also possible to extend the life of the ferroelectric random access memory.

The displacement shift parts and the crossover displacement shift part crossing each other makes it possible to reduce the number of plate lines, compared to the case where the plate wiring parts simply follow a step-like pattern. Also, it is possible to reduce the regions for laying out plate lines connected to the uppermost and lowermost memory cells in a memory cell array (dummy regions).

As a result, the size of a plate line driver and a decoder can be reduced, making reducing the size or improving the integration density of the peripheral circuits possible. Also, the memory cell array can be downsized.

Figure 18A:
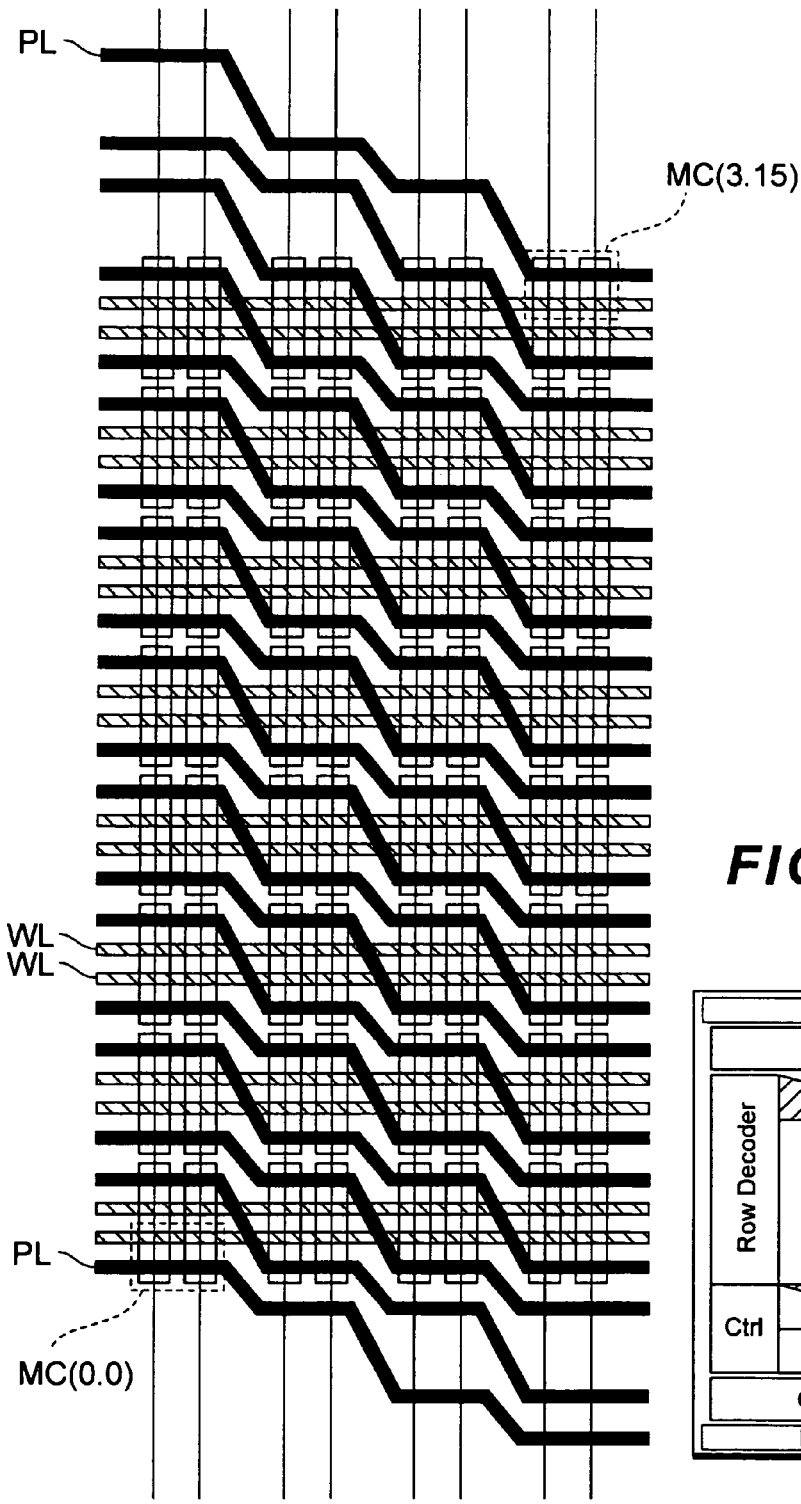
FIG. 18A is a plain view of a main part of ferroelectric random access memory where plate lines change their displacements with respect to a second direction, forming a step-like pattern.
Figure 18B:
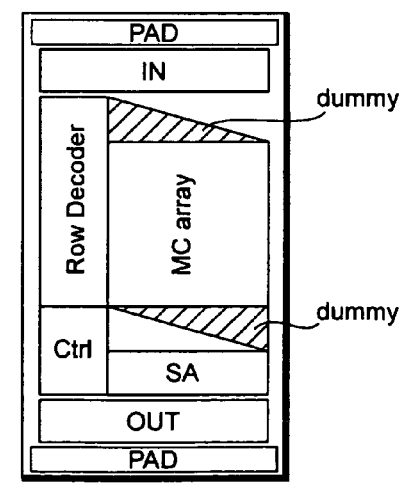
FIG. 18B is a schematic view of the ferroelectric random access memory.

For example, FIG. 18A shows a plain view of a main part of ferroelectric random access memory where the plate lines simply follow a step-like pattern, and FIG. 18B shows a schematic diagram of that ferroelectric random access memory.

As shown in FIG. 18A, a plate line PL connected to a memory cell (0, 0), which is the zeroth in the first direction and the zeroth in the second direction, and a plate line PL connected to a memory cell (3, 15), which is the third in the first direction and the fifteenth in the second direction, respectively extend over broad regions below and above the memory array. Thus, as shown in FIG. 18B, a dummy region is required for each of the areas above and below the memory cell array.

Also, the number of plate lines has increased by three lines compared to the example shown in FIG. 1. Accordingly, the plate line driver and decoder in the row decoder will also necessarily become larger. Incidentally, Ctrl represents a control circuit, IN represents an input circuit, OUT represents an output circuit, SA represents a sense amplifier circuit, and PAD represents a pad.

On the other hand, with the embodiment of the invention, the previously mentioned effects can be obtained.

The displacement shift parts and the displacement crossover shift part are crossed between the column blocks, resulting in a reduction in size or an improvement the integration density of the memory cell array. In addition, the wiring layout is not complicated.

Figure 2:
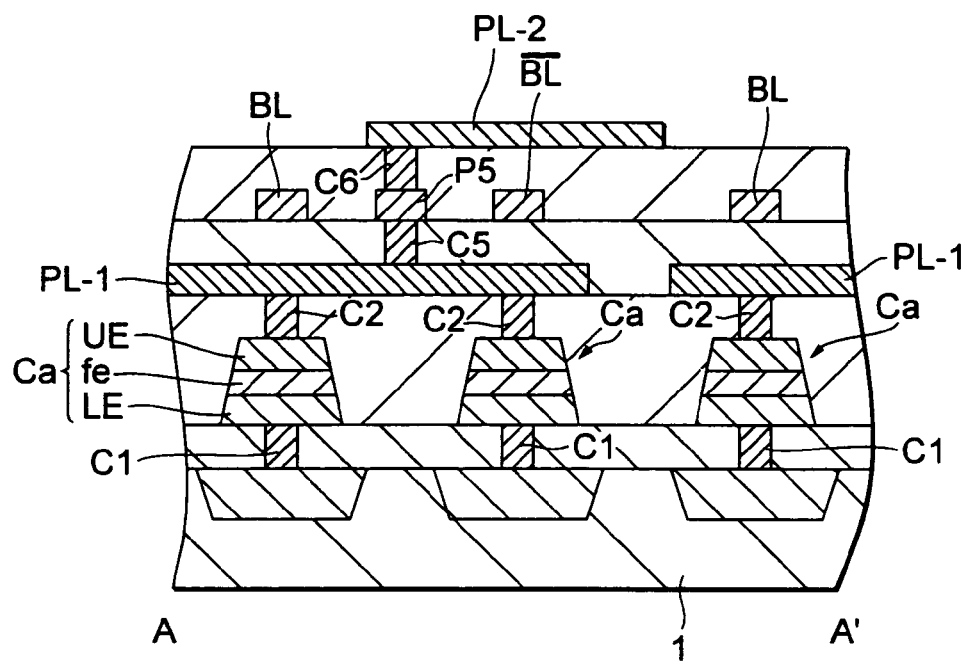
FIG. 2 is a cross-sectional view of a main part of ferroelectric random access memory according to Embodiment 1.

Next, the detailed structure of the ferroelectric random access memory according to this Embodiment will be explained with reference to FIGS. 2 to 8. FIGS. 2 and 3 are cross-sectional views of the main part of the ferroelectric random access memory according to this Embodiment. FIGS. 4 to 8 are plain views of the main part.

Figure 7:
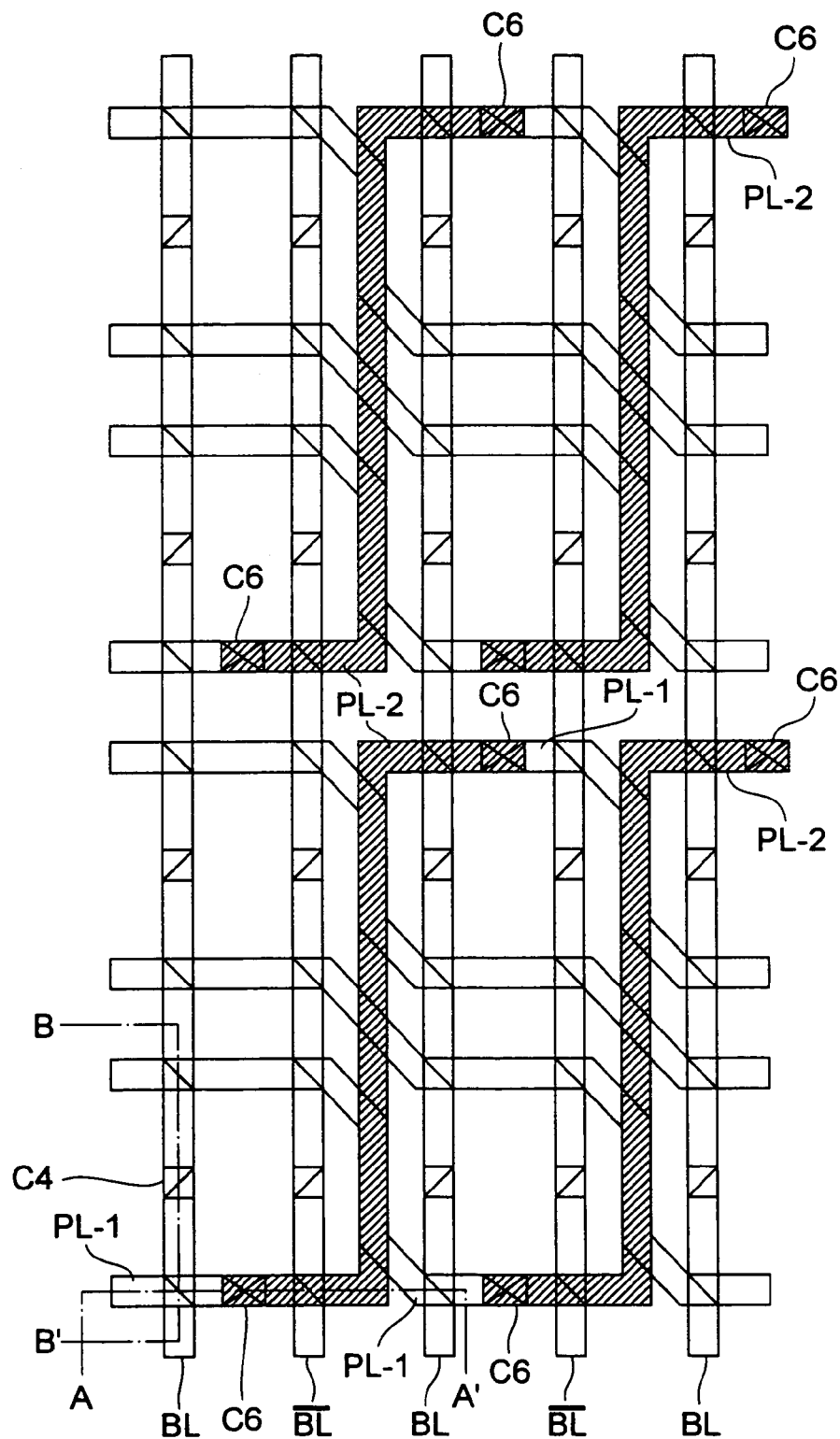
FIG. 7 is a plain view of a main part of ferroelectric random access memory according to Embodiment 1.
Figure 8:
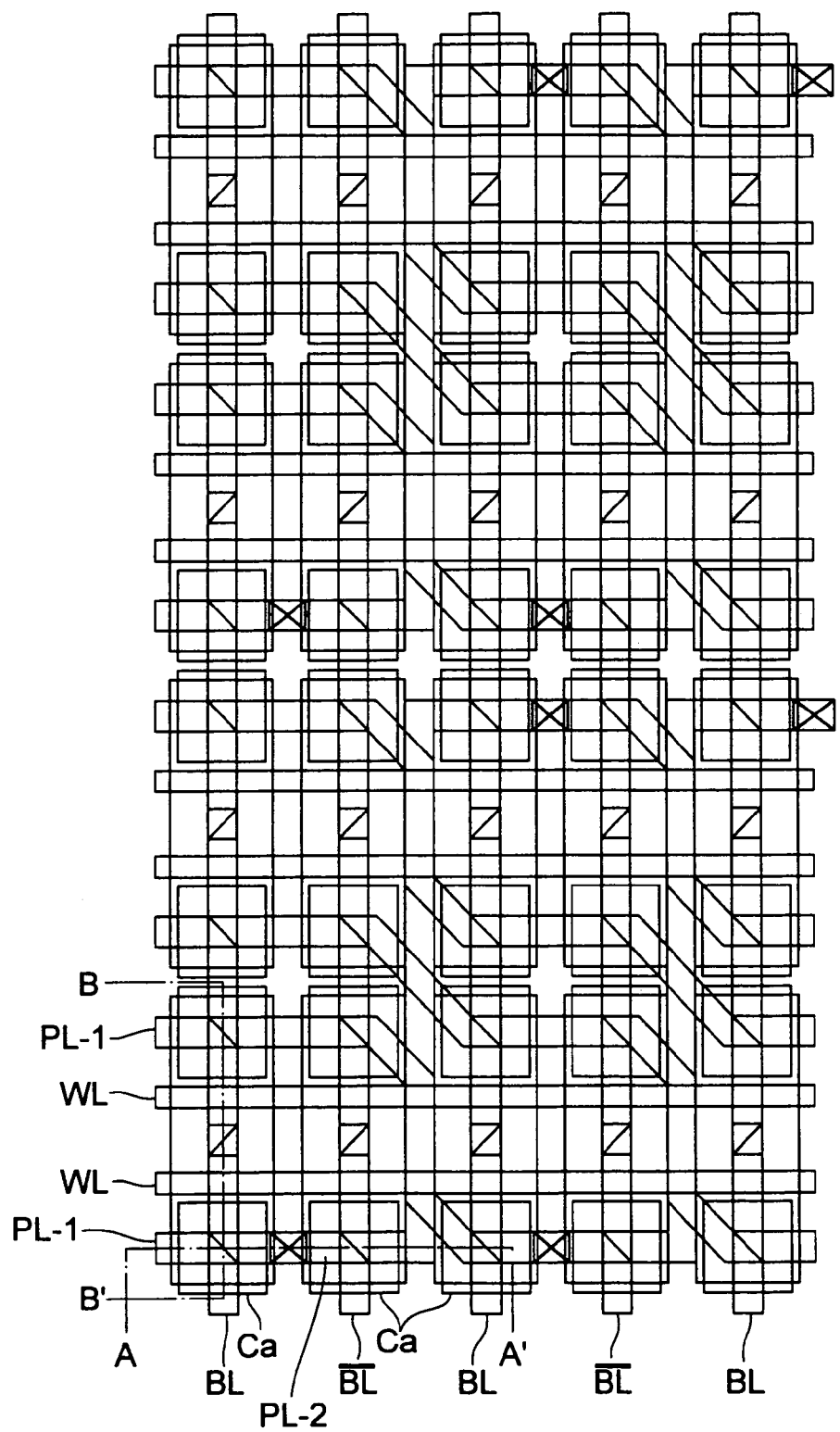
FIG. 8 is a plain view of a main part of ferroelectric random access memory according to Embodiment 1.

For example, FIG. 8 is a plain view showing in detail a part of the memory cell array shown in FIG. 1. FIG. 2 is a cross-sectional view of the memory cell array part shown in FIG. 8 taken along line A-A'. FIG. 3 is a cross-sectional view of the memory cell array part shown in FIG. 8 taken along line B-B'. FIGS. 3 to 7 show a pattern in each layer of the memory cell array. Hereinafter, the structure of each layer will be clarified in the order it is made.

Figure 4:
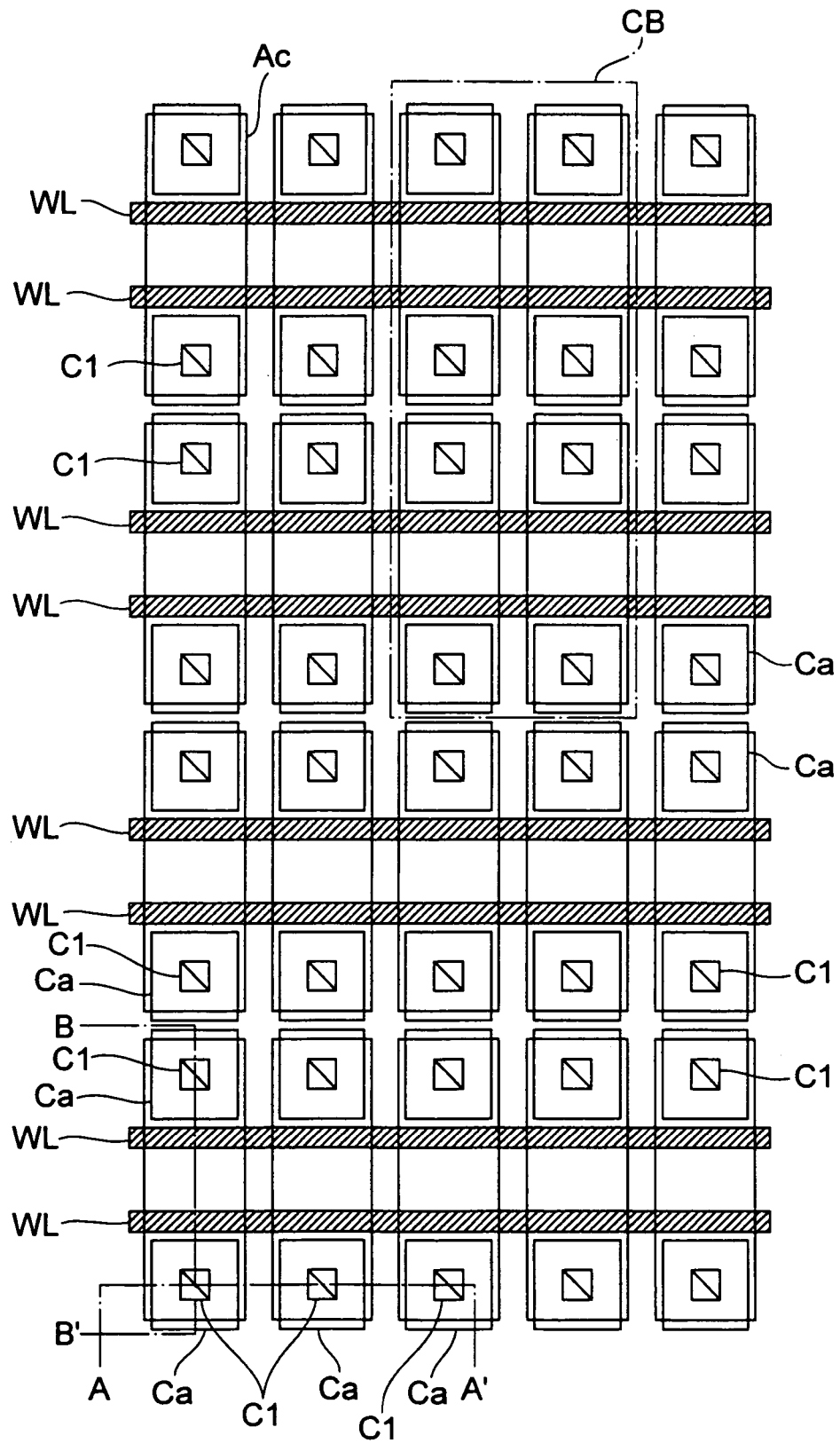
FIG. 4 is a plain view of a main part of ferroelectric random access memory according to Embodiment 1.

As shown in FIGS. 2, 3, and 4, element-formed regions Ac are formed on a semiconductor substrate (substrate) 1 (FIG. 4). These element-formed regions Ac are defined by forming an insulating film therebetween.

Next, transistors T are formed. First, semiconductor films (e.g., silicon films) are formed in lines extending in the first direction as gate electrodes G on the semiconductor substrate (substrate) 1 via a gate insulating film (not shown). Next, source/drain electrodes are formed by doping impurities to both sides of the gate electrodes G. Next, an interlayer insulating film is formed on the transistors T, and contact holes are formed by patterning the interlayer insulating film, and a conductive layer is embedded inside the contact holes to form contact parts C1.

Next, a capacitor Ca is formed above each of the contact parts C1. First, a conductive film, which will be lower electrodes (LE), is deposited on the interlayer insulating film including the contact parts C1, and then a ferroelectric film fe is deposited above the interlayer insulating film. A conductive layer, which will be upper electrodes UE, is deposited above the ferroelectric film fe, and these layers are patterned to form capacitors Ca.

Figure 5:
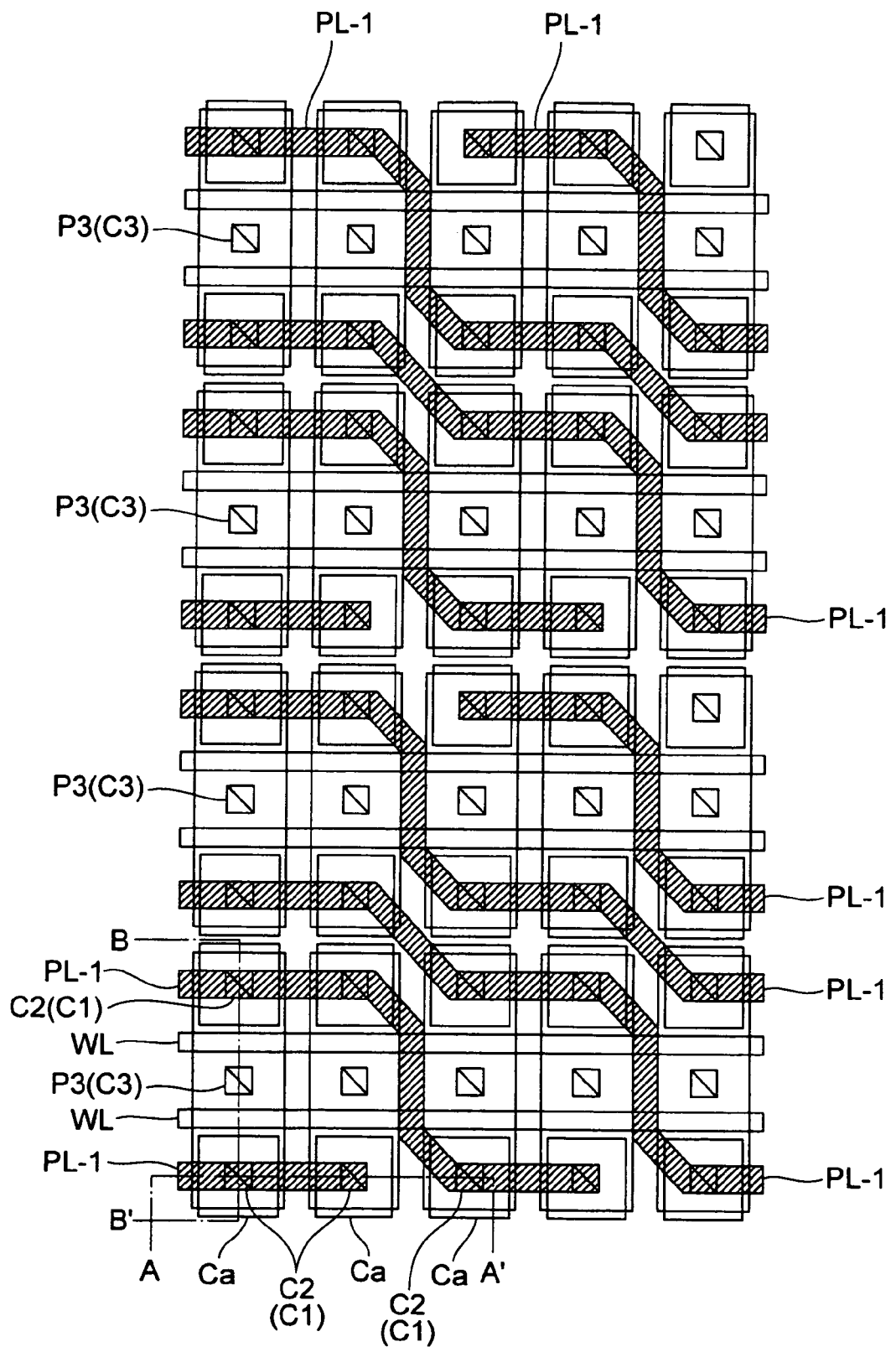
FIG. 5 is a plain view of a main part of ferroelectric random access memory according to Embodiment 1.

Next, as shown in FIGS. 2, 3, and 5, an interlayer insulating film is formed on the capacitors Ca, and after contact holes are formed by patterning the interlayer insulating film above the upper electrodes UE, contact parts C2 are formed by embedding a conductive film inside the contact holes. At this time, contact parts C3 are also formed on the source/drain electrodes of the transistors T.

Next, a conductive film is deposited on the interlayer insulating film containing the contact parts C2, and the conductive film is patterned to form plate lines PL-1. At this time, substantially-rectangular regions P3 are formed on the contact parts C3.

Here, as shown in FIG. 5, each plate line PL-1 consists of plate wiring parts (straight line parts) connected to two contacts C2 in each of the relevant column blocks in the first direction, and displacement shift parts connecting the plate wiring parts between the relevant column blocks. As described above, each plate wiring part is arranged so that it changes its displacement with respect to the second direction one level every column block. However, the lowermost plate wiring part in a column block is connected via a crossover displacement shift part to the uppermost plate wiring part in the neighboring column block. However, the crossover part does not appear in the layer shown in FIG. 5, but is formed with a wiring in the further upper layer.

Figure 6:
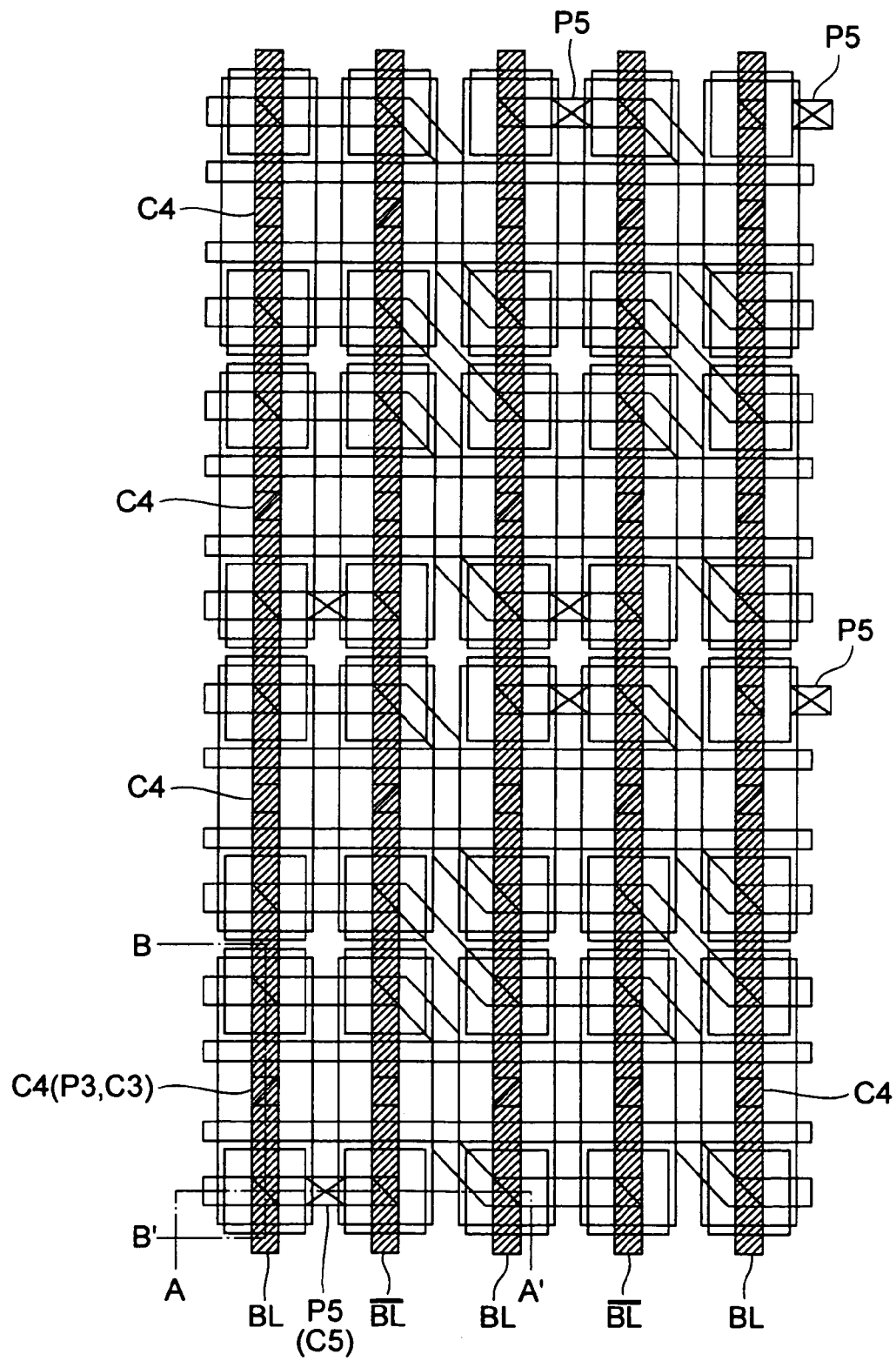
FIG. 6 is a plain view of a main part of ferroelectric random access memory according to Embodiment 1.

Next, as shown in FIGS. 2, 3, and 6, an interlayer insulating film is formed on the plate lines PL-1, and the interlayer insulating film on the regions P3 (contact parts C2) is patterned to form contact holes. A conductive film is embedded inside these contact holes to form contact parts C4. Similarly, a contact part C5 is formed on the lowermost plate wiring part PL-1 in each column block.

Next, a conductive film is deposited on the interlayer insulating film containing the contact parts C5, and then patterned into lines extending in the second direction to form bit lines (BL, /BL). As shown in FIG. 6, the bit lines (BL, /BL) extend in the second direction so that they are connected to contact parts C4 (P3, C3) extending in the second direction. At this time, a substantial rectangular region P5 is also formed above each of the contact parts C5.

Next, as shown in FIGS. 2, 3, and 7, an interlayer insulating film is formed above the bit lines (BL, /BL), the interlayer insulating film on the regions (contact parts) P5 is patterned to form contact holes, and a conductive film is embedded inside the contact holes to form contact parts C6.

Next, a conductive film is deposited on the interlayer insulating film containing the contact parts C6 to form plate lines PL-2 (crossover displacement shift parts) so that they connect the contact parts C6 in their adjacent column blocks.

As a result, the lowermost plate wiring part in each column block and the uppermost plate wiring part in each neighboring column block are connected via a crossover displacement shift part PL-2.

Thus, this Embodiment makes it possible to form displacement shift parts (plate line PL-1), and crossover displacement shift parts (plate lines PL-2) on different layers. Accordingly, the displacement shift parts and the crossover displacement shift parts cross between the column blocks, resulting in a reduction in size or an improvement the integration density of the memory cell array.

This Embodiment is explained taking a 16-row by 4-column memory cell array as an example. However, there is no limitation on the number of rows and columns in an array, and for example, a 128-row by 32-column memory cell array may be used.

Figure 9:
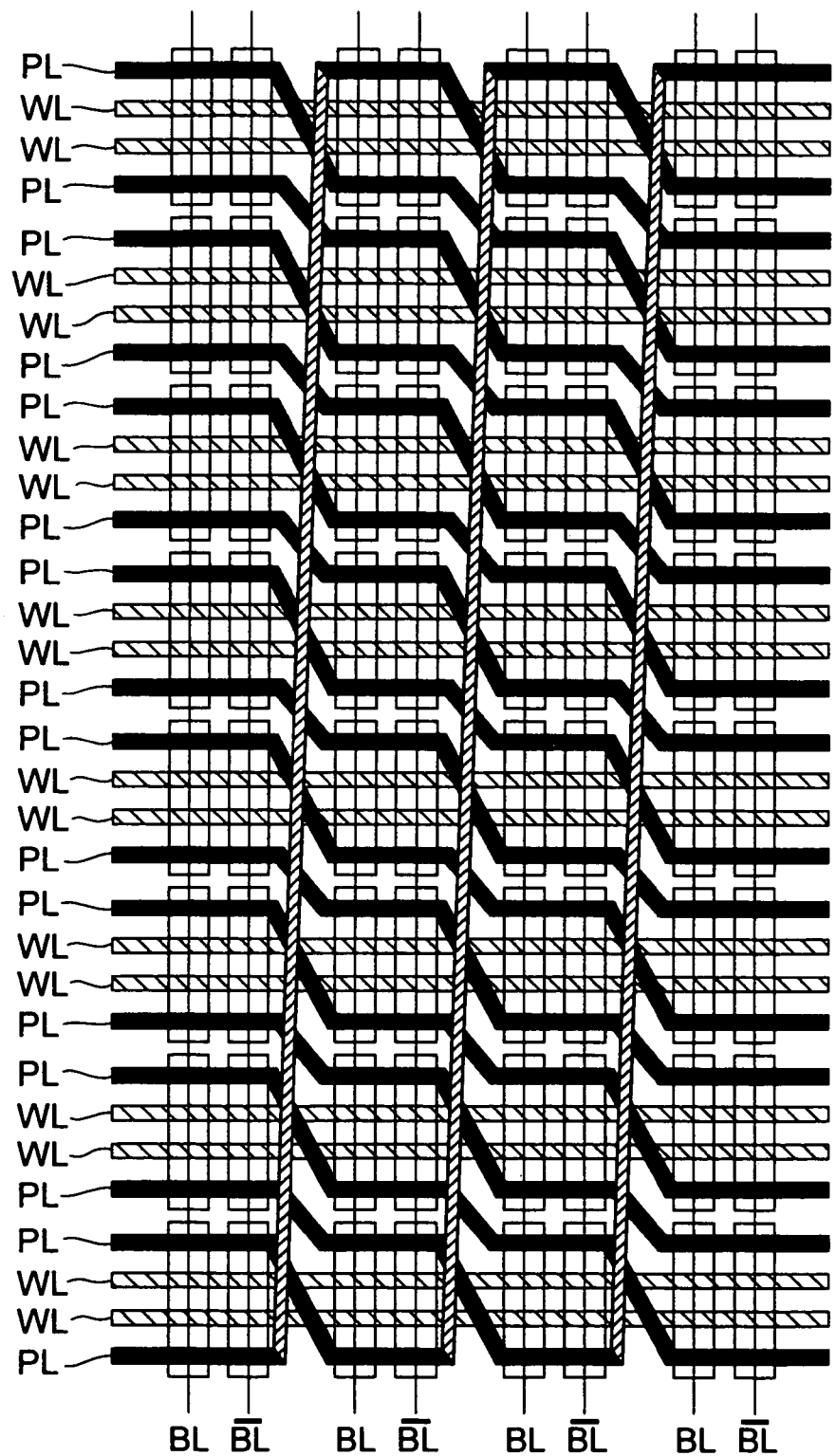
FIG. 9 is a schematic plain view of a main part of other ferroelectric random access memory according to Embodiment 1.

In this Embodiment, each column block consists of a 4-row by 1-column memory cell configuration. However, there is no limitation on the number of cells in a column block. For example, as shown in FIG. 9, a column block may consist of a 16-row by 1-column memory cell configuration. FIG. 9 is a plain view schematically showing the main part of other ferroelectric random access memory according to this Embodiment. As shown in FIG. 9, when the number of rows in each column block is 1, there will be no memory cells connected in common to the same plate line and word line, eliminating the need to provide a sense amplifier to each bit line pair, and thus making it possible to share a sense amplifier.

Also, for example, the number of rows of memory cells constituting a column block may be two or more (e.g., 4 rows by 2 columns). However, if the number of rows of memory cells constituting a column block is two or more, two memory cells lined up in the first direction are connected to the same word line and plate line, causing non-selected cells to be read, and requiring re-writing to these non-selected cells.

The number of column blocks constituting a memory cell array in the first direction is preferably set to be fewer than the number of rows of memory cells constituting each column block.

For example, when a n-row by m-column memory cell array is divided into column blocks; q column blocks in the first direction and r in the second direction, if memory cells constituting each column block consist of a t-row by s-column memory cell configuration, q is preferably equal to or less than t. A memory cell array is also preferably divided so that q is equal to or less than t.

Meanwhile, if the number of columns in each column block increases and the number of crossover connection parts (crossover parts) also increases, the number of memory cells connected to the same word line and plate line will increase, causing the aforementioned non-selected cell reading, and required re-writing.

If the column number of column blocks constituting a memory cell array direction is set to be the same as the row number of memory cells constituting each column block, the layout of plate lines in the memory cell array can be optimized, and accordingly, the number of plate lines can also be optimized.

In other words, in the case of the above n-row by m-column memory cell array, q is preferably equal to t. The memory cell array is also preferably divided so that q is equal to t. For example, in the FIG. 1 example, t=q=4.

In this Embodiment, the number of levels each plate line shifts is one, but it may also be two or more.

In this Embodiment, the direction the plate line changes displacement is the downward direction in the figures, but it may also be the upward direction.

Also in this Embodiment, plate lines change their displacements, but word lines may change their displacements and plate lines may be straight lines. However, the word lines, as shown in FIG. 3 and others, consist of the gate electrodes G in the transistor parts. These gate electrodes are generally formed from semiconductor material, and have a high resistance compared to metal wires. Accordingly, if these word lines change their displacements and follow a step-like pattern, they will have a higher resistance, which may cause signal delay. Therefore, it is more effective that the plate lines change their displacements, rather than the word lines.

Embodiment 2

Another embodiment of the invention will be explained in detail with reference to the drawings.

Figure 10:
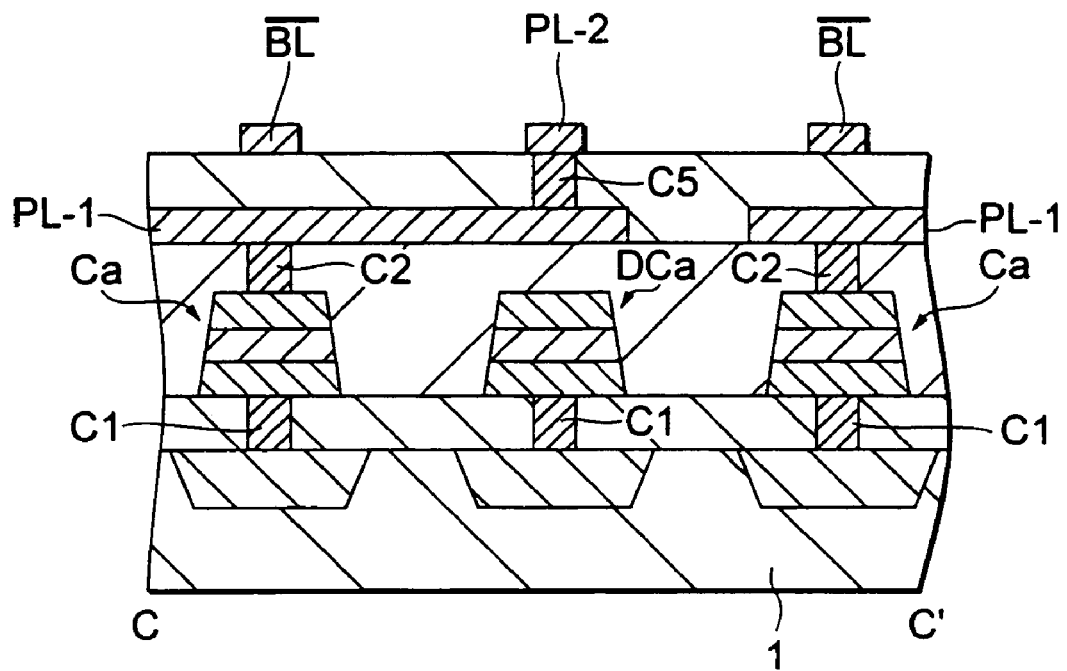
FIG. 10 is a cross-sectional view of a main part of ferroelectric random access memory according to Embodiment 2.
Figure 11:
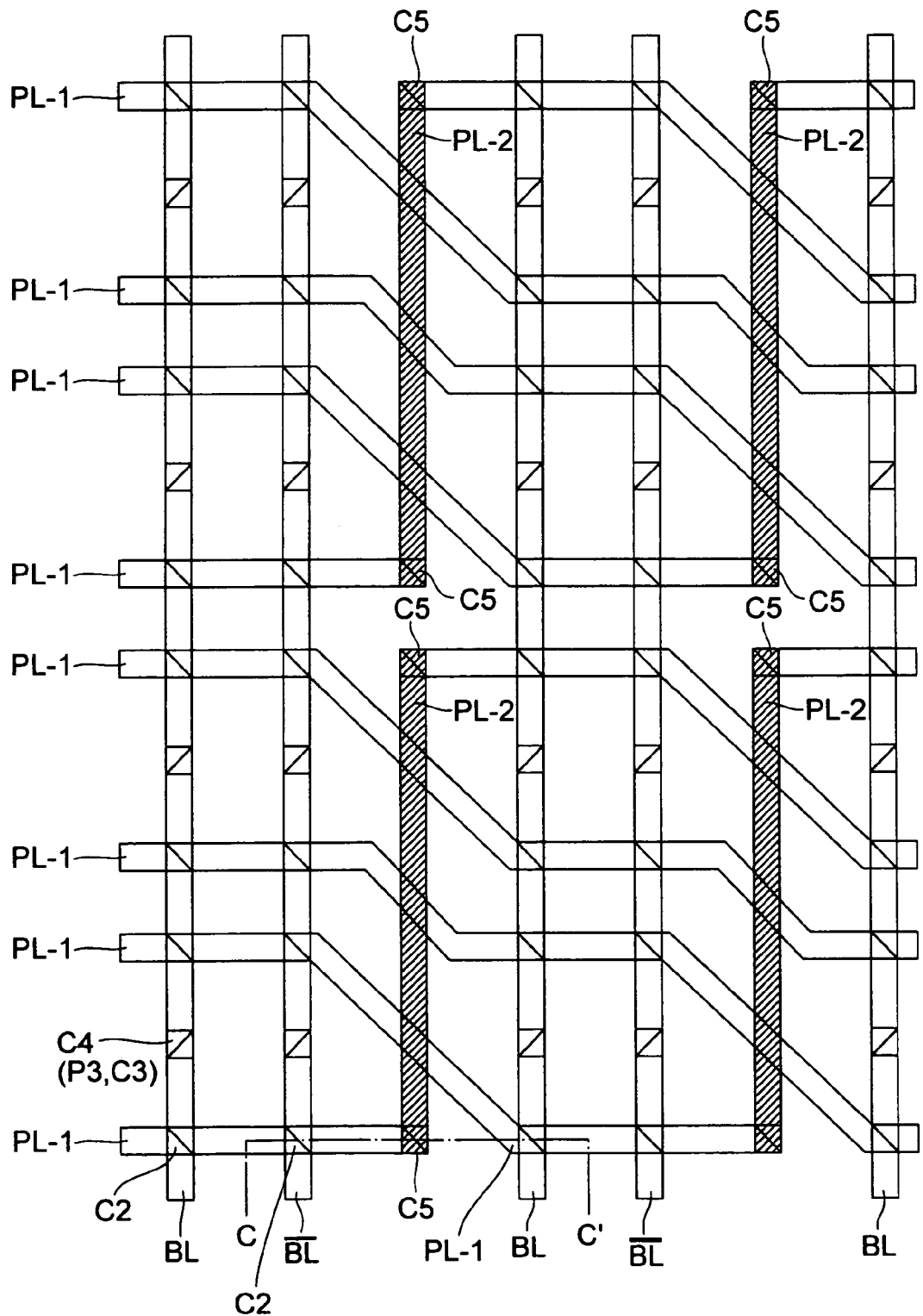
FIG. 11 is a plain view of a main part of ferroelectric random access memory according to Embodiment 2.
Figure 12:
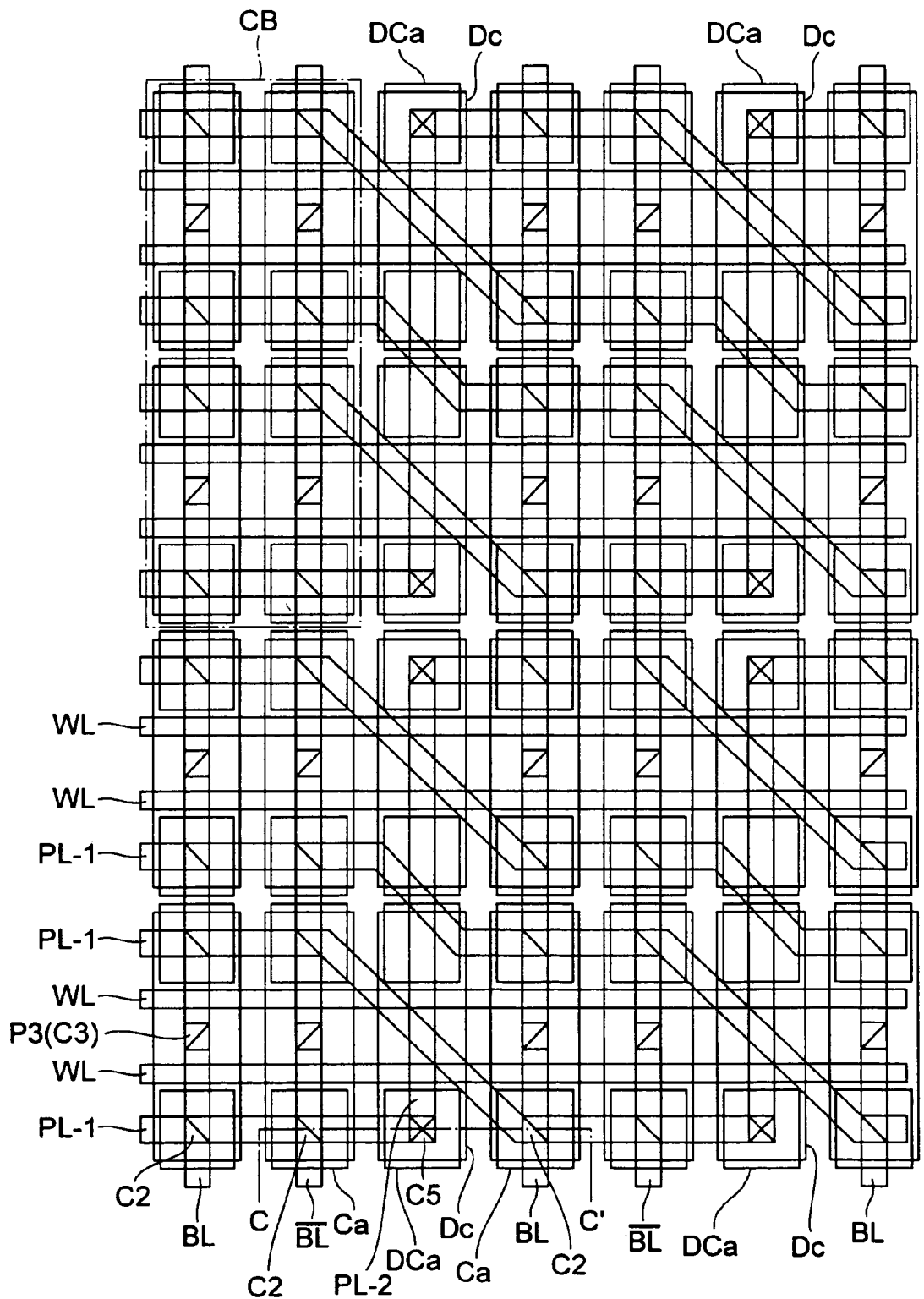
FIG. 12 is a plain view of a main part of ferroelectric random access memory according to Embodiment 2.

The detailed structure of ferroelectric random access memory according to Embodiment 2 will be explained below with reference to FIGS. 10 to 12. FIG. 10 is a cross-sectional view of a main part of the ferroelectric random access memory according to this Embodiment, and FIGS. 11 and 12 are plain views of the main part of the same. FIG. 10 is a cross-sectional view of the memory shown in FIG. 12 taken along line C-C'. FIG. 11 shows the bit line and plate line layout. In the ferroelectric random access memory according to this Embodiment, the same reference numerals are provided for the components common to those in Embodiment 1, and their explanation will not be repeated, and only characteristic points of this Embodiment will be explained in detail.

As shown in FIGS. 10 to 12, in this Embodiment, dummy cells Dc are arranged between the column blocks in the second direction (the column direction or bit line direction). Accordingly, as shown in FIG. 11, it is possible to guarantee regions where the plate lines PL-1 change their displacement with respect to the second direction, and thus it is possible to guarantee wiring spaces.

As shown in FIGS. 10 to 12, each memory cell MC consists of transistors and capacitors Ca. Meanwhile, each dummy cell Dc has dummy transistors and dummy capacitors DCa.

The memory cells MC and dummy cells Dc are formed with the same manufacturing method used in Embodiment 1. However, as shown in FIG. 10 and others, the contacts C2 are not formed on the dummy capacitors DCa.

Also, as shown in FIG. 11 and others, each plate line PL-1 consists of a plate wiring part connecting two contacts C2 arranged in the first direction for every block, and a displacement shift part connecting the plate wiring parts between the column blocks.

The displacement shift parts are arranged on the dummy cell columns. Each plate wiring part is arranged so that it changes its displacement one level every column block, which is the same as in Embodiment 1. The lowermost plate wiring part in a column block is connected to the uppermost plate wiring part in the neighboring column block via a crossover displacement shift part PL-2. This crossover displacement shift part is formed from wiring in the layer above the displacement shift parts (here, the layer is in the same layer as the bit lines BL).

In Embodiment 2, the uppermost or lowermost plate wiring part is arranged so that it extends up to the position above the dummy capacitor DCa of the dummy cell in the same row (FIG. 10 and others). Also, contact parts C5 are formed above that plate wiring part PL-1.

The bit lines (BL, /BL) extend in the second direction so that they connect contact parts C4 (P3, C3) arranged in the second direction, which is the same as in Embodiment 1. When forming the bit lines (BL, /BL), plate lines PL-2 (crossover displacement shift parts) are also formed so that they form connections between the contact parts C5 on the dummy cells Dc in the second direction. As a result, the lowermost plate wiring part in each column block is connected to the uppermost plate wiring part in each neighboring column block via a plate line PL-2 (crossover displacement shift part or connection wiring part) (FIG. 11 and others).

According to this Embodiment, a dummy cell column is provided between the column blocks, and a plate line can changes its displacement with respect to the second direction using the region above the dummy cell column, making it possible to guarantee a wiring space between the plate lines (especially, a wiring space between the displacement shift parts).

Also, a crossover displacement shift part for a plate line can be formed using a region where a bit line for dummy cells is formed. As a result, bit lines and crossover displacement shift parts are formed in the same layer. In other words, at least one (crossover displacement shift part) from among the connection wiring parts (three displacement shift parts and one crossover displacement shift part) connecting the plate wiring parts can be formed in the same layer as the bit lines. If the number of levels each plate line shifts is two, for example, two of the connection wiring parts will be crossover displacement shift parts.

As described above, forming the bit lines and the crossover displacement shift parts in the same layer simplifies the manufacturing process. Also, wirings are arranged on the regions above the dummy cells where there is no need to form bit lines, making the wiring spacings uniform.

The plate lines changes their displacements with respect to the second direction using the regions above the dummy cell columns (in other words, spaces between the bit lines). However, in a device having fine design rules where a large space can be formed between the bit lines, crossover displacement shift parts (PL-2) may be formed in the same layer as the bit lines without providing dummy cell columns.

For example, an n-row by m-column memory array is divided into column blocks; q in the first direction and r in the second direction. If the memory cells constituting each column block consist of t memory cells in the row direction and s memory cells in the column direction, displacement shift parts and a crossover displacement shift part are formed between the s-th bit line from among the first to s-th bit lines connecting the t memory cells arranged in the second direction in a column block, and the first bit line in the neighboring column block.

Embodiment 3

In Embodiment 3, a method for selecting a plate line (memory cell selection method) will be explained.

For example, when word lines and plate lines extend in the first direction, and are connected to memory cells MC arranged in the same rows, and bit line pairs extend in the second direction and are connected to the memory cells MC in the same columns, a memory cell can easily be selected. In other words, the address for the selected cell directly corresponds to the selected word line, plate line and bit line pair.

However, when the plate lines change their displacements with respect to the second direction, it is necessary to perform a predetermined calculation based on the selected cell address to determine the plate line to be selected.

Figure 13:
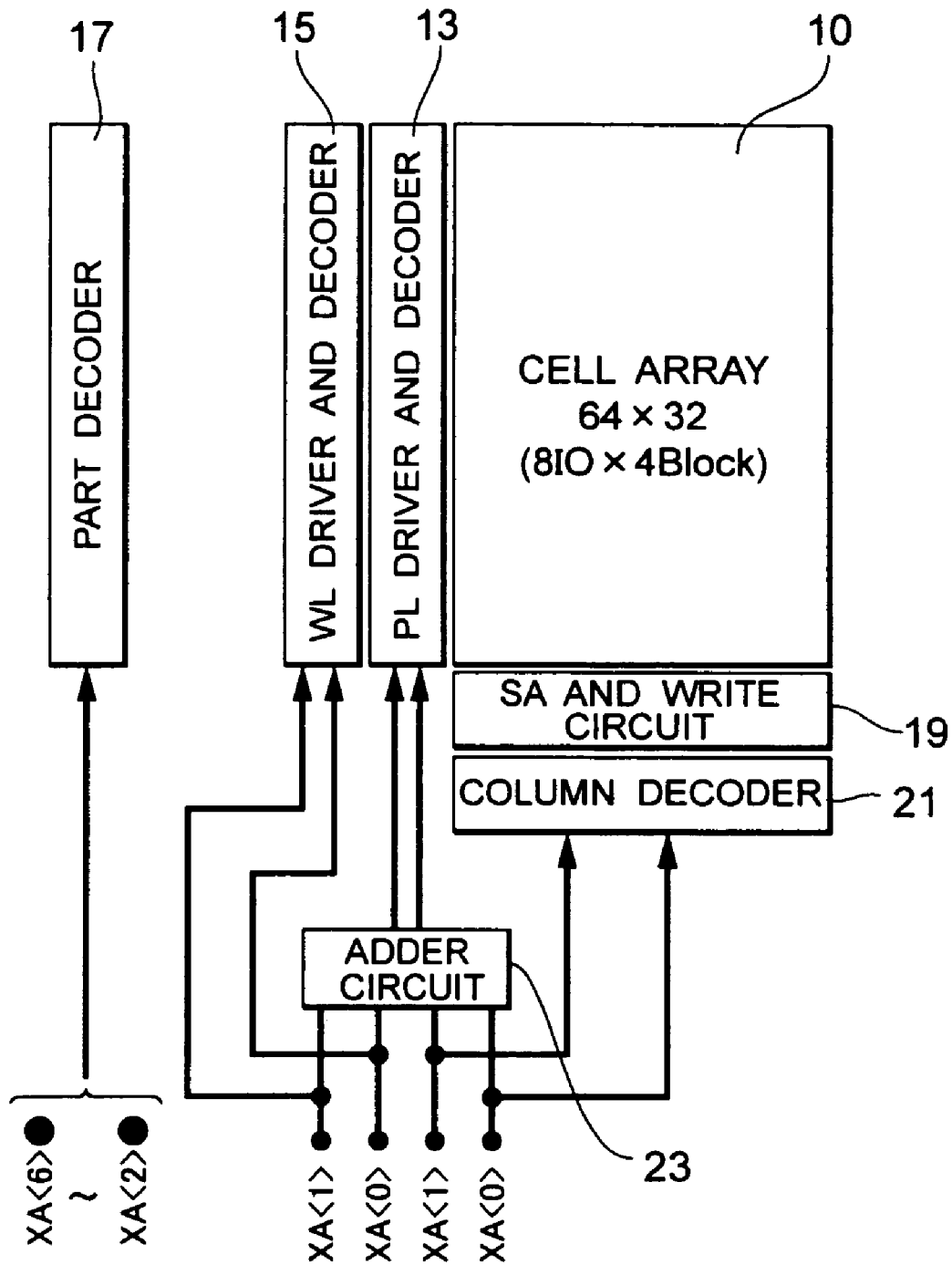
FIG. 13 is a block diagram showing the structure of ferroelectric random access memory according to Embodiment 3.

FIG. 13 is a block diagram showing the structure of ferroelectric random access memory according to this Embodiment. As shown in the figure, peripheral circuits to drive the memory are arranged around the memory cell array 10. The memory cell array consists of a 64-row by 32-column memory cell configuration where column blocks, each consisting of an 8-row by 8-column memory cell configuration, are arranged in 8 rows by 4 columns (8IO by 4Block). Here, the number of rows in each column block is 8, which is the cube of 2.

In the first direction (word line direction) of the memory cells, a plate line driver and decoder circuit 13, and a word line driver and decoder circuit 15 are arranged. A memory block (part) decoder circuit 17 is also arranged. In the second direction (bit line direction) of the memory cells, a sense amplifier and write circuit 19 is arranged, and also a column decoder 21 is arranged.

Based on the selected cell address (XA, YA), the word line driver and decoder circuit 15 selects a word line, and based on the selected cell address (XA, YA), the column decoder circuit 21 selects a bit line (pair).

When selecting a plate line, an adder circuit 23 performs a calculation based on the selected cell address (XA, YA), and based on the calculation result, selects a plate line.

Figure 14:
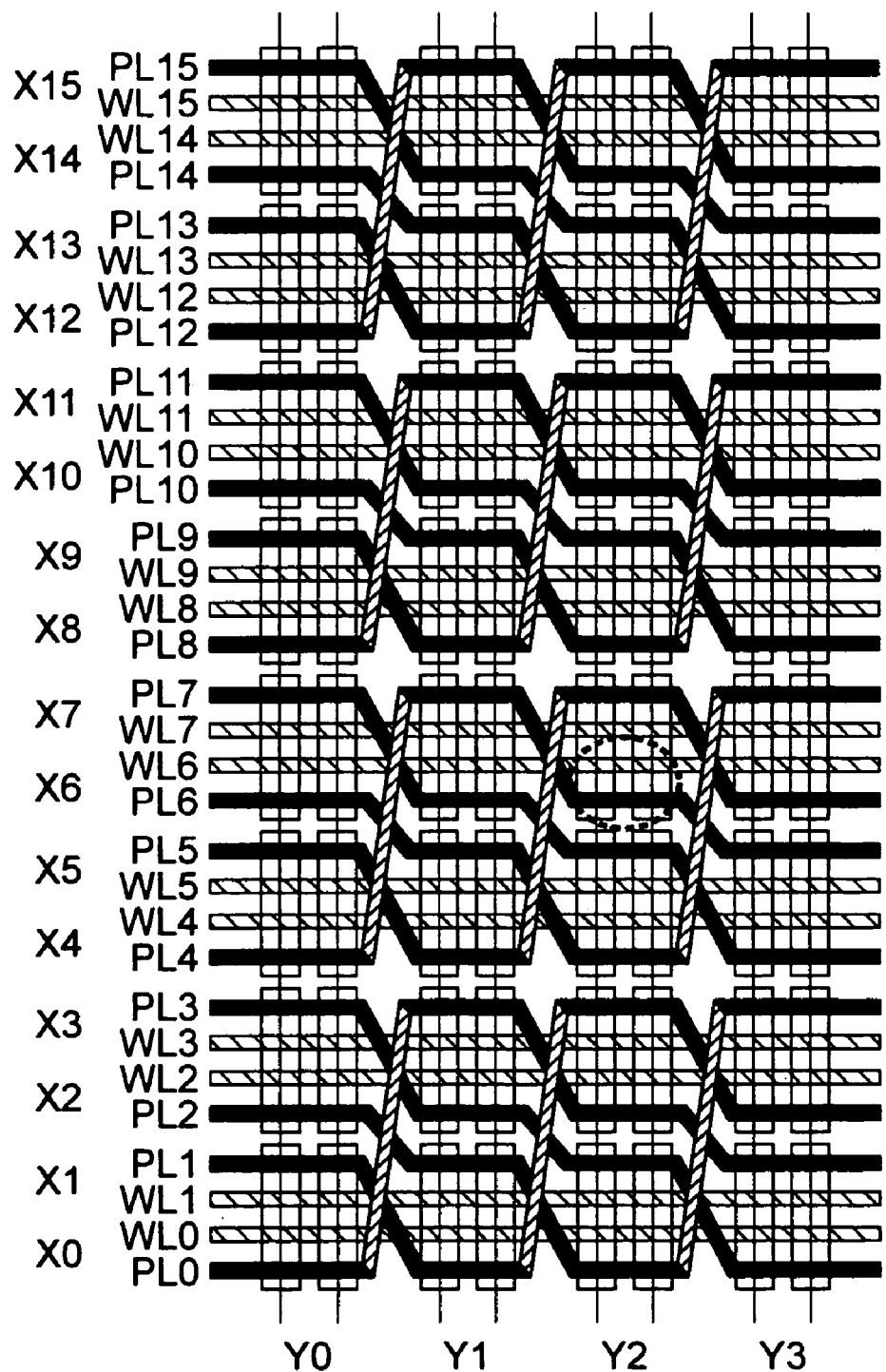
FIG. 14 is a plain view of ferroelectric random access memory for explaining a method for selecting a plate line according to Embodiment 3.

This calculation by the adder circuit 23 will be explained with reference to the 16-row by 4-column memory cell array explained in relation to Embodiment 1. FIG. 14 is a plain view of ferroelectric random access memory for explaining a method for selecting a plate line according to Embodiment 3.

For example, when a memory cell (Y2, X6) circled in FIG. 14 is selected, a calculation with (110), which is the binary representation of X6, and (010), which is the representation of Y2, is performed.

The number of rows in each column block is 4 (i.e., 4 memory cells are arranged longitudinally), that is, the square of 2. So, first, if there is the third digit from the back of the aforementioned memory cell addresses (110) and (010), 1 will be put next to the front digit, and then a calculation is performed with regard to the last two digits in each of the aforementioned addresses. In that case, the calculation will be (10)+(10), and the result will be (100). Then, the third digit from the back of (100) is ignored, i.e., no carrying is conducted for the calculation, the last two digits (00) and the aforementioned "1" are combined to obtain the calculation result (100). Accordingly, a plate line PL4 is selected.

For example, if the address for the memory cell to be selected is the j-th in the first direction (1≦j≦m, j=J+1), and the k-th in the second direction (1≦k≦n, k=K+1), and the column block containing that memory cell is the g-th in the first direction (1≦g≦q, g=G+1), (a) the sum of the binary K and the binary G is calculated; and (b) if the (v+1)-th digit from the back in the binary K is 1, a plate line is selected based on a binary numerical value, which has been obtained by combining "1" and the numerical value of the last v digits from the back in the binary representation of the sum. Meanwhile, (c) if there is no (v+1)-th digit from the back, a plate line is selected based on the numerical value of the last v digits in the binary representation of the sum. For example, when a memory cell (Y1, X3) in FIG. 14 is selected, a calculation with (11), which is the binary representation of X1, and (1), which is the binary representation of Y1, is performed, and based on the last two digits in the calculation result (100), i.e., (00), a plate line PL0 is selected.

Figure 15:
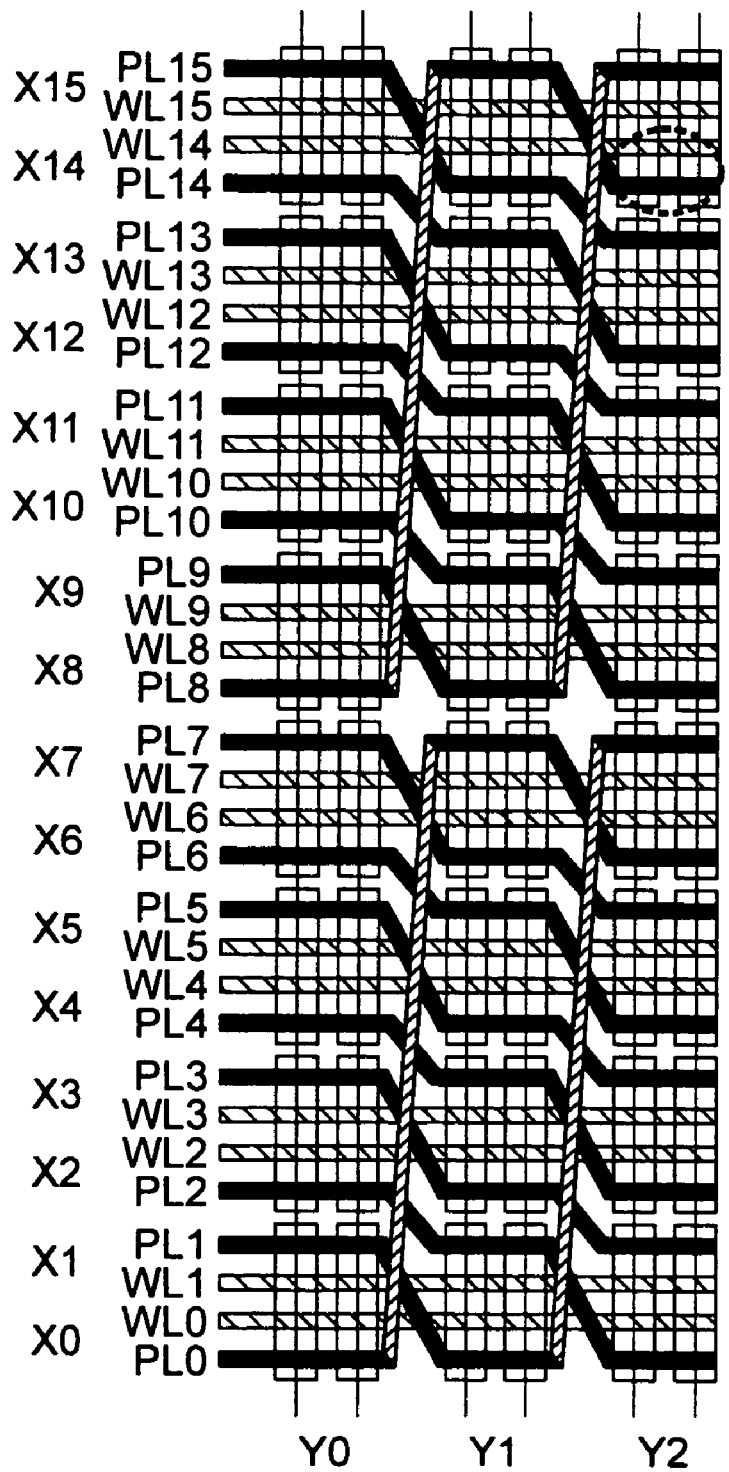
FIG. 15 is another plain view of ferroelectric random access memory for explaining a method for selecting a plate line according to Embodiment 3.

The calculation can be performed in the same way when the number of rows in the column block shown in FIG. 15 is 8 (the cube of 2). FIG. 15 is another plain view of ferroelectric random access memory for explaining a method for selecting a plate line according to Embodiment 2.

For example, when the memory cell (Y2, X14) circled in FIG. 15 is selected, a calculation is performed with (1110), which is the binary representation of X14, and (10), which is the binary representation of Y2.

Here, the number of rows in each column block is 8 (i.e., eight memory cells are arranged longitudinally), that is, the cube of 2, so v=3. First, if there is the 4 (=v+1)-th digit from the back of the aforementioned memory cell addresses (1110) and/or (10), 1 will be put next to the front digit. Then, a calculation is performed with the last three (=v) digits in the aforementioned memory cell addresses. In that case, the calculation will be (110)+(10), and the result will be (1000). The 4 (=v+1)-th digit from the back of (1000) is ignored, and the last three (=v) digits (000), and the aforementioned "1" are combined, and (1000) will be determined as the calculation result. Accordingly, a plate line PL8 is selected.

As explained above, if the number of rows in each column block is the v-th power of 2, it is possible to select a plate line based on the adder circuit's calculation result.

Embodiment 4

In Embodiment 3, a plate line is selected using an adder circuit; however, if the number of rows in each column block is not the v-th power of 2, a subtractor circuit will be required in addition to the adder circuit.

Figure 16:
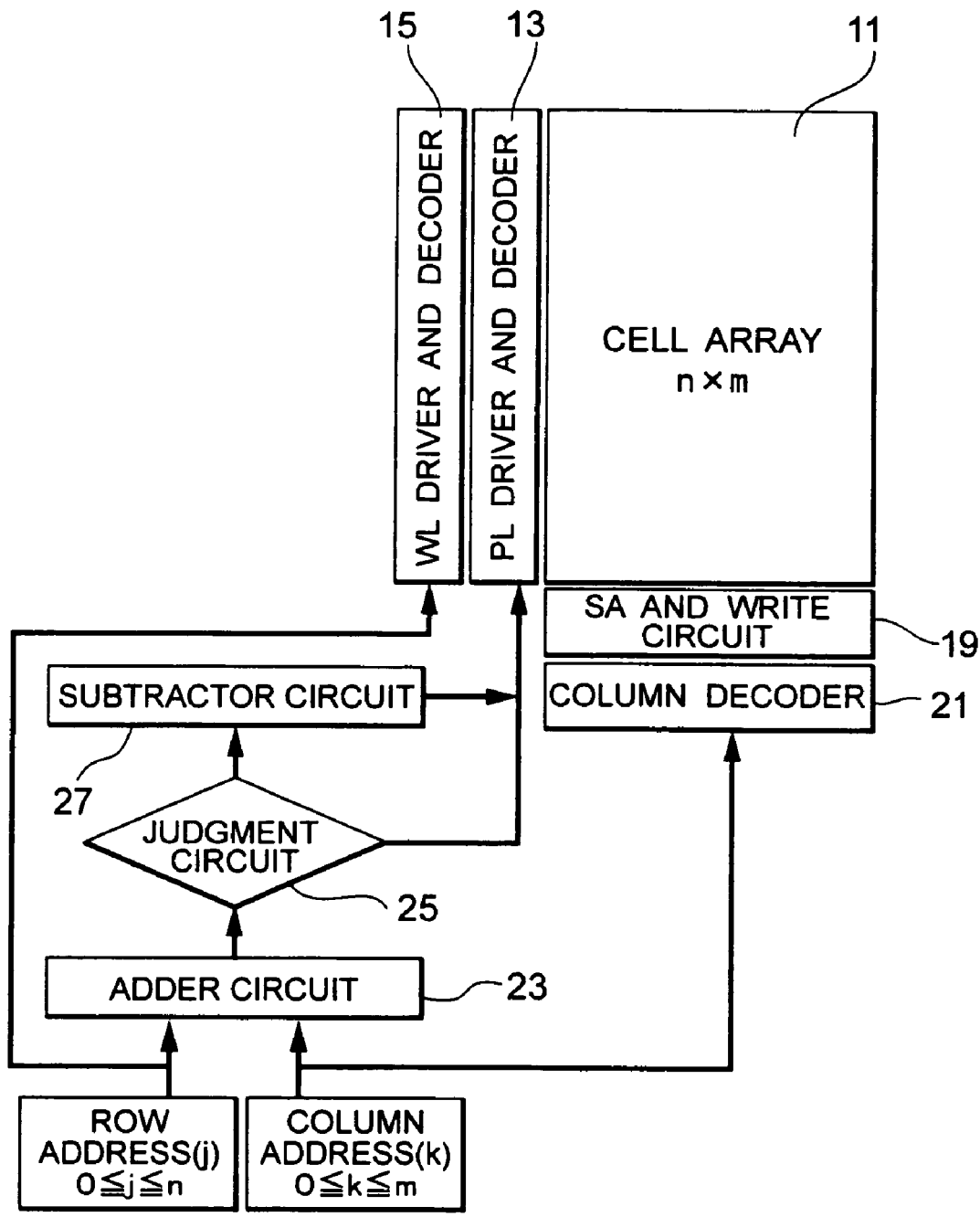
FIG. 16 is a block diagram showing the structure of ferroelectric random access memory according to Embodiment 4.

The above case will be explained below. FIG. 16 is a block diagram showing the structure of ferroelectric random access memory according to Embodiment 4. The same reference numerals are provided for the components that are the same as those in Embodiment 3, and the explanation of those components will not be repeated.

Embodiment 4 is different from Embodiment 3 in the structure of a memory cell array 11, and the existence of a judgment circuit part 25 and a subtractor circuit 27. As stated above, the number of rows in each column block obtained by dividing the memory cell array 11 is not a power of 2.

Like in Embodiment 1, a word line and a bit line (pair) are selected based on the selected cell address (XA, YA).

When selecting a plate line, a calculation is performed at the adder circuit 23, the judgment circuit part 25, and the subtractor circuit 27 based on the selected cell address (XA, YA), and a plate line is selected based on the results.

Figure 17:
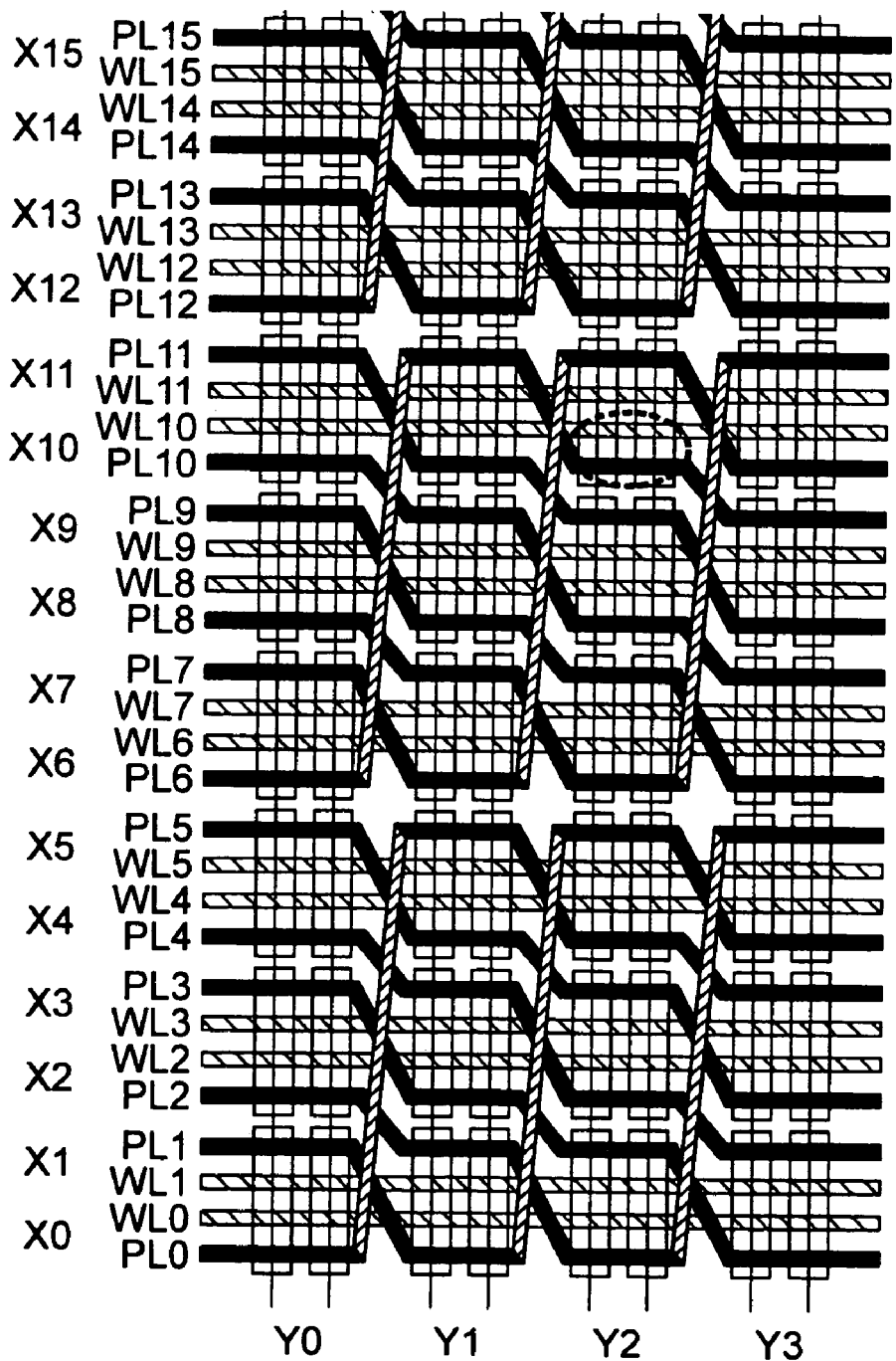
FIG. 17 is a plain view of ferroelectric random access memory for explaining a method for selecting a plate line according to Embodiment 4.

A method for selecting a plate line when the number of rows in each column block shown in FIG. 17 is 6, which is not a power of 2, will be explained below in detail.

FIG. 17 is a plain view of ferroelectric random access memory for explaining a method for selecting a plate line according to Embodiment 4. In this Embodiment, each column block consists of a 6-row by 1-column memory cell configuration.

For example, when the memory cell circled in that figure (Y2, X10) is selected, the sum in decimal representation will be 12 (=2+10), and a plate line PL12 will be selected (although PL6 should be selected). Therefore, if the calculation result (12) in the adder circuit 23 is 6, which is the number of rows in each column block, or more at the judgment circuit part 25, the number of rows in each column block is subtracted at the subtractor circuit 27 from the sum, and based on the subtraction result, the plate line PL6 (=12−6) will be selected. This example is explained with the decimal system, but the same result will be obtained if the calculation is performed with the binary system.

In other words, the address of the memory cell to be selected is the j-th ($1 \leq j \leq m$, j=J+1) in the first direction, and the k-th ($1 \leq k \leq n$, k=K+1) in the second direction, and the column block containing that memory cell is the g-th ($1 \leq g \leq q$, g=G+1) in the first direction, (a) the sum of K and G is calculated by the adder circuit, and (b) if the sum is equal to or exceeds the number of rows in the column block (t), a plate line is selected from the result after t is subtracted from the sum.

As explained above, this Embodiment makes it possible to accurately select the plate line even though the plate line has a displaced and crossed-over structure.

Also, when the number of rows in each column block is a power of 2, which has been explained as Embodiment 3, the plate line selection circuit according to Embodiment 4 may be used.

What is claimed is:

1. A semiconductor memory device comprising:
a memory cell array with m memory cells arranged in a first direction and n memory cells arranged in a second direction in a grid, each memory cell having a capacitor part using a ferroelectric film, and also having a first terminal, a second terminal, and a third terminal;
two or more first wirings connecting the first terminals of the m memory cells arranged in the first direction;
two or more second wirings connecting the second terminals of the n memory cells arranged in the second direction;
two or more third wirings connecting the third terminals of the m memory cells, the third wirings including,
from among unit blocks resulting from dividing the memory cell array into q sections in the first direction and r sections in the second direction, each unit block having s memory cells arranged in the first direction and t memory cells arranged in the second direction in a grid,
first to t-th wiring parts connecting the s memory cells arranged in the first direction in a first unit block,
first to t-th wiring parts connecting the s memory cells arranged in the first direction in a second unit block located next to the first unit block in the first direction, and
a connection wiring part connecting a u-th ($1 \leq u \leq t$) wiring part from among the first to t-th wiring parts in the first unit block and a wiring part other than a u-th ($1 \leq u \leq t$) wiring part from among the first to t wiring parts in the second unit block; and
means for selecting a third wiring from among the third wirings, the third wiring being selected based on the result of calculation in an adder circuit and a subtractor circuit.

2. The semiconductor memory device according to claim 1, wherein:
the selection of the third wiring is performed by the sum of K and G being calculated by the adder circuit when the u-th ($1 \leq u < t$) wiring part in the first unit block and the (u+1)-th wiring part in the second unit block are connected via a first connection wiring part, and the t-th wiring part in the first unit block and the first wiring part in the second unit block are connected via a second connection wiring part and also when an address for a memory cell to be selected is the j ($1 \leq j \leq m$, j=J+1)-th in the first direction, and the k-th ($1 \leq k \leq n$, k=K+1) in the second direction and the unit block containing the memory cell is the g-th ($1 \leq g \leq q$, g=G+1) in the first direction; and
if the sum is equal to or exceeds t, the selection is performed based on the result of t being subtracted from that sum.

3. A semiconductor memory device comprising:
a memory cell array with m memory cells arranged in a first direction and n memory cells arranged in a second direction in a grid, each memory cell having a capacitor part using a ferroelectric film, and also having a first terminal, a second terminal, and a third terminal;
two or more first wirings connecting the first terminals of the m memory cells arranged in the first direction;
two or more second wirings connecting the second terminals of the n memory cells arranged in the second direction;
two or more third wirings connecting the third terminals of the m memory cells, the third wirings including,
from among unit blocks resulting from dividing the memory cell array into q sections in the first direction and r sections in the second direction, each unit block having s memory cells arranged in the first direction and t memory cells arranged in the second direction in a grid,
first to t-th wiring parts connecting the s memory cells arranged in the first direction in a first unit block, and
first to t-th wiring parts connecting the s memory cells arranged in the first direction in a second unit block located next to the first unit block in the first direction, and
a connection wiring part connecting a u-th ($1 \leq u \leq t$) wiring part from among the first to t-th wiring parts in the first unit block and a wiring part other than a u-th ($1 \leq u \leq t$) wiring part from among the first to t wiring parts in the second unit block; and
means for selecting a third wiring from among the third wirings, wherein:
t is the v-th power of 2; and
the means for selecting the third wiring selects the third wiring based on an adder circuit's calculation result.

4. The semiconductor memory device according to claim 3, wherein:
the selection of the third wiring is performed by the sum of a binary K and a binary G being calculated by the adder circuit when the u-th ($1 \leq u < t$) wiring part in the first unit block and the (u+1)-th wiring part in the second unit block are connected via a first connection wiring part, and the t-th wiring part in the first unit block and the first wiring part in the second unit block are connected via a second connection wiring part, and also when an address for a memory cell to be selected is the j ($1 \leq j \leq m$, $j=J+1$)-th in the first direction, and the k-th ($1 \leq k \leq n$, $k=K+1$) in the second direction, and the unit block containing the memory cell is the g-th ($1 \leq g \leq q$, $g=G+1$) in the first direction;

the selection is performed based on a binary numeral value combining 1 and a numerical value of the last v digits in the binary representation of the sum if a (v+1)-th digit from the back in the binary K is 1, and based on the numerical value of the last v digits in the binary representation of the sum if there is no (v+1)-th digit from the back in the binary K.

5. The semiconductor memory device according to claims 1, wherein the connection wiring parts are crossed between the first unit block and the second unit block.

6. The semiconductor memory device according to claims 1, wherein, from among first to s-th second wirings, in the second wirings, connecting the t memory cells arranged in the second direction in each of the first and second unit blocks, the connection wiring parts are crossed between the s-th second wiring in the first unit block and the first second wiring in the second unit block.

\* \* \* \* \*